(12) United States Patent
Kim et al.

(10) Patent No.: US 8,330,164 B2
(45) Date of Patent: Dec. 11, 2012

(54) THIN FILM TRANSISTOR ARRAY PANEL

(75) Inventors: Myoung-Sup Kim, Suwon-si (KR);
Cheon-Jae Maeng, Suwon-si (KR);
Jun-Young Jung, Ulsan-si (KR);
Dong-Hyun Yoo, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 186 days.

(21) Appl. No.: 12/732,779

(22) Filed: Mar. 26, 2010

(65) Prior Publication Data

US 2011/0095293 A1   Apr. 28, 2011

(30) Foreign Application Priority Data

Oct. 27, 2009  (KR) .................. 10-2009-0102476

(51) Int. Cl.
*H01L 29/04* (2006.01)
*H01L 29/10* (2006.01)
*H01L 31/036* (2006.01)

(52) U.S. Cl. ............. 257/59; 257/72; 257/E33.053; 257/E21.411; 438/29; 438/34

(58) Field of Classification Search .......... 257/E33.067, 257/E33.053

See application file for complete search history.

(56) References Cited

U.S. PATENT DOCUMENTS

| | | | | |
|---|---|---|---|---|
| 2003/0136971 A1* | 7/2003 | Rhee et al. | ...................... | 257/98 |
| 2004/0195573 A1* | 10/2004 | Kim | ................................ | 257/72 |
| 2006/0003479 A1* | 1/2006 | Park et al. | ....................... | 438/30 |
| 2006/0157705 A1* | 7/2006 | Ki | ................................... | 257/59 |
| 2009/0008646 A1* | 1/2009 | Kim et al. | ....................... | 257/59 |

* cited by examiner

*Primary Examiner* — Michelle Mandala
*Assistant Examiner* — Shaka White
(74) *Attorney, Agent, or Firm* — F. Chau & Associates, LLC

(57) ABSTRACT

A thin film transistor array panel includes: a substrate, a gate line disposed on the substrate, a data line intersecting the gate line, a drain electrode separated from the data line a first insulating layer covering the data line, a color filter disposed on the first insulating layer, a second insulating layer disposed on the color filter and having a contact hole exposing the drain electrode and the color filter and a pixel electrode disposed on the second insulating layer and connected to the drain electrode through the contact hole. The contact hole partially exposes the color filter near a portion where the drain electrode and the pixel electrode are connected to each other, and the pixel electrode covers the color filter exposed through the contact hole.

25 Claims, 11 Drawing Sheets

THIN FILM TRANSISTOR ARRAY PANEL

CROSS-REFERENCE TO RELATED APPLICATION

This application claims priority to Korean Patent Application No. 10-2009-0102476 filed on Oct. 27, 2009, the entire disclosure of which is hereby incorporated by reference herein in it's entirety.

BACKGROUND OF THE INVENTION (a) Technical Field

The present disclosure relates to a thin film transistor array panel and to a method of manufacturing thereof.

(b) Description of the Related Art

A thin film transistor (TFT) display panel may be used as a circuit board for independently driving pixels in a liquid crystal display or an organic electro-luminescent (EL) display device. The thin film transistor array panel may include a scanning signal line or a gate line transmitting a scanning signal, an image signal line or a data line transmitting an image signal, a thin film transistor connected to the gate line and the data line, and a pixel electrode connected to the thin film transistor.

In the operation of the thin film transistor array panel, the scanning signal and the data signal may be transmitted through the gate line and the data line, and the thin film transistor may control the data signal transmitted to the pixel electrode according to the scanning signal.

Here, the gate line and the data line may be made of a conductive material such as, for example, a metal. The pixel electrode may be made of a transparent conductive material such as, for example, indium tin oxide (ITO) or indium zinc oxide (IZO), and ITO and IZO may be used as an assistance layer to provide contact reliability when the gate line and the data line are connected to an external driving circuit.

When the color filter is formed in the thin film transistor array panel, it may be damaged in the process of forming a contact portion where the pixel electrode and the thin film transistor are connected to each other.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention may simultaneously prevent generation of a slight change due to damage to the color filter and a filling failure of liquid crystal.

In accordance with an exemplary embodiment of the present invention, a thin film transistor array panel is provided. The thin film transistor array panel includes: a substrate, a gate line disposed on the substrate, a data line intersecting the gate line, and a drain electrode separated from the data line, a first insulating layer covering the data line, a color filter disposed on the first insulating layer, a second insulating layer disposed on the color filter and having a contact hole exposing the drain electrode and the color filter and a pixel electrode disposed on the second insulating layer and connected to the drain electrode through the contact hole. The contact hole partially exposes the color filter near the portion where the drain electrode and the pixel electrode are connected to each other, and the pixel electrode covers the color filter exposed through the contact hole.

The contact hole has a first region, second region and a third region, wherein the first region is a portion where the drain electrode and the pixel electrode contact each other, the second region is a portion where the color filter and the pixel electrode contact each other, and the third region is a portion where the second insulating layer covers the side wall of the color filter.

The second region may be a portion where the color filter and the pixel electrode contact at the upper surface and the side wall of the color filter.

At least one of the first insulating layer and the second insulating layer is made of an inorganic insulating material.

The plane shape of the second region may be extended in a first direction from the central part of the first region.

The plane shape of the second region may be extended in the first direction from the central part of the first region while having the same width as the first region.

The plane shape of the second region may be extended in leftward and rightward directions from the central part of the first region, thereby forming a straight shape.

The plane shape of the second region may be extended in leftward, rightward, upward, and downward directions from the central part of the first region, thereby forming a cross shape.

The color filter may be made of an organic material.

In accordance with another exemplary embodiment of the present invention, a method of manufacturing a thin film transistor array panel is provided. The method includes forming a gate line on a substrate, forming a data line intersecting the gate line, and a drain electrode separated from the data line, forming a first insulating layer covering the data line, forming a color filter having an opening on the first insulating layer, forming a second insulating layer covering the opening on the color filter, forming a contact hole by patterning the first insulating layer and the second insulating layer and forming a pixel electrode contacting the drain electrode filling the contact hole. The forming of the contact hole includes exposing the upper surface of the drain electrode and eliminating a portion of the second insulating layer covering the color filter in a position adjacent to the opening.

Forming the pixel electrode may comprise covering directly the color filter exposed by eliminating a portion of the second insulating layer.

Forming the color filter having an opening may comprise using a photolithography process.

Forming the contact hole may comprise forming a first region where the drain electrode and the pixel electrode contact each other, a second region where the color filter and the pixel electrode contact each other, and a third region where the second insulating layer covers the color filter.

At least one of the first insulating layer and the second insulating layer may be made of an inorganic insulating material.

The plane shape of the second region may be extended in a first direction from the central part of the first region.

The plane shape of the second region may be extended in the first direction from the central part of the first region while having the same width as the first region.

The plane shape of the second region may be extended in leftward and rightward directions from the central part of the first region, thereby forming a straight shape.

The plane shape of the second region may be extended in leftward, rightward, upward, and downward directions from the central part of the first region, thereby forming a cross shape.

According to exemplary embodiments of the present invention, when patterning an inorganic insulating layer covering the color filter, a portion of the color filter may be exposed, and the remaining portion thereof may cover the inorganic insulating layer such that a slight change due to damage to the color filter may be prevented, and a filling failure of the liquid crystal due to discharge of the color filter material may be prevented.

BRIEF DESCRIPTION OF THE DRAWINGS

Exemplary embodiments of the present invention can be understood in more detail by reference to the following detailed description in conjunction with the accompanying drawings in which.

Figure 1:
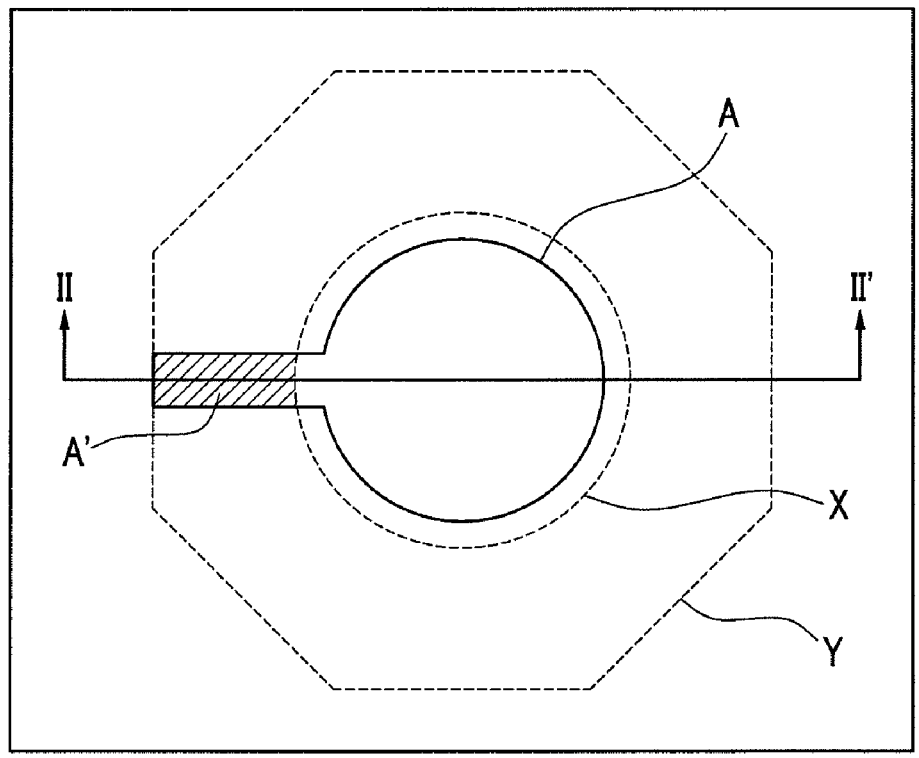
FIG. 1 is a top plan view of a contact portion according to an exemplary embodiment of the present invention.

In the drawings, the thicknesses of layers and regions are exaggerated for clarity. It is to be noted that when a layer is referred to as being "on" another layer or substrate, it can be directly formed on the other layer or substrate or can be formed on the other layer or substrate with a third layer interposed therebetween. Like constituent elements are denoted by like reference numerals throughout the specification.

Figure 2:
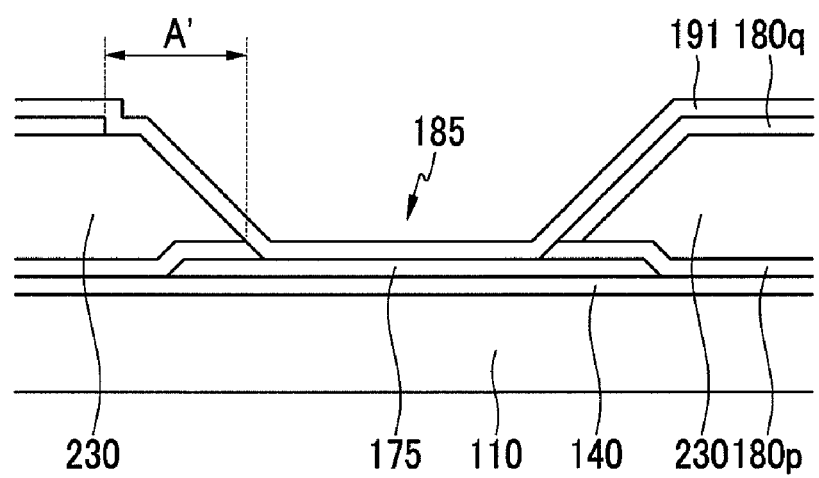
FIG. 2 is a cross-sectional view taken along the line II-II' of FIG. 1.
Figure 3:
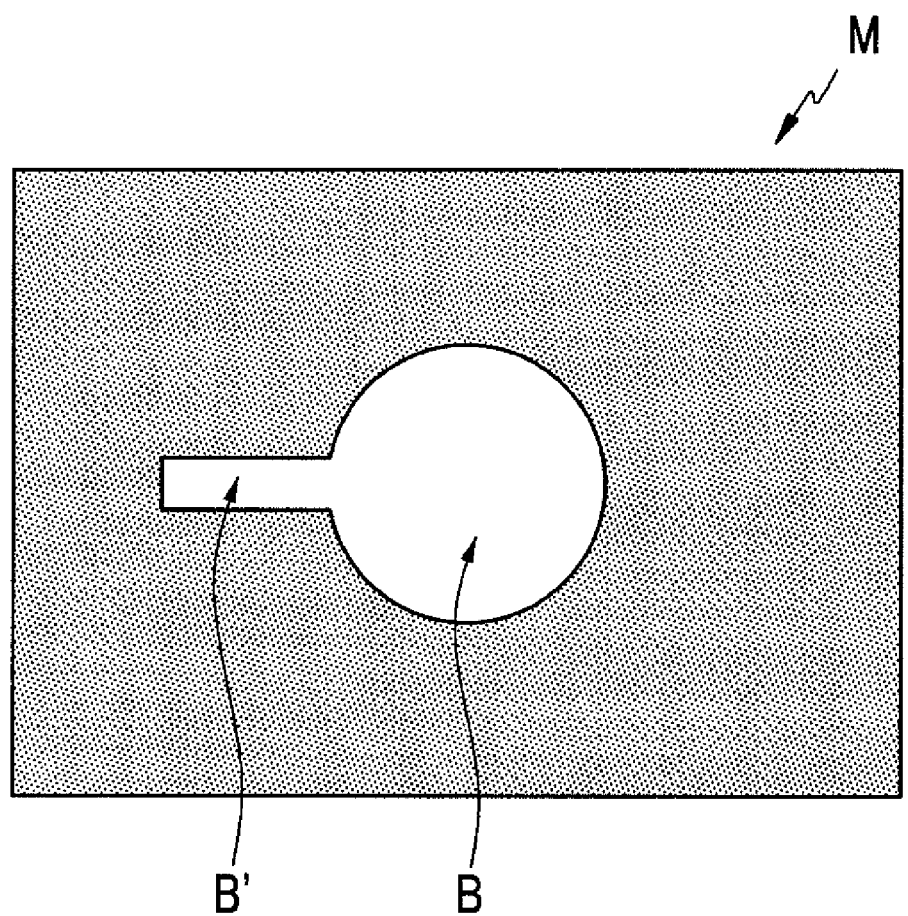
FIG. 3 is a top plan view of a mask used in the exemplary embodiment shown in FIG. 1.

FIG. 1 is a top plan view of a contact portion according to an exemplary embodiment of the present invention, FIG. 2 is a cross-sectional view taken along the line II-II' of FIG. 1, and FIG. 3 is a top plan view of a mask used in the exemplary embodiment shown in FIG. 1.

Referring to FIG. 1 and FIG. 2, a gate insulating layer 140 is formed on an insulation substrate 110. A first electrode 175 that is made of a metal material is formed on the gate insulating layer 140.

A lower passivation layer 180p, an organic layer 230, and an upper passivation layer 180q are sequentially formed on the first electrode 175, and a contact hole 185 exposing the first electrode 175 and passing through the lower passivation layer 180p, the organic layer 230, and the upper passivation layer 180q is formed. The first electrode 175 is connected to a second electrode 191 through the contact hole 185. The structure of the contact hole 185 will be described in detail.

The contact hole 185 includes a first region A, a second region A', and a third region Y. In the first region A, the first electrode 175 and the second electrode 191 contact each other. In the second region A', a portion of the upper surface of the organic layer 230 and a side wall thereof contact the second electrode 191. In the third region Y, the upper surface of the organic layer 230 and the side wall thereof are covered by the upper passivation layer 180q. For example, in a view of a plane side, the third region Y may be a region X where the first region A is expanded and the portion except for the second region A'.

According to an exemplary embodiment of the present invention, in the contact portion where the first electrode 175 and the second electrode 191 contact each other, the upper passivation layer 180q covers almost the whole organic layer 230, and the second electrode 191 covers the remaining part

| <Description of Reference Numerals Indicating Primary Elements in the Drawings> | | | |
|---|---|---|---|
| 3 | liquid crystal layer | 11, 21 | alignment layer |
| 100 | lower substrate | 110, 210 | insulation substrate |
| 121 | gate line | 124a, 124b | gate electrode |
| 131 | storage electrode line | 140 | gate insulating layer |
| 171a, 171b | data line | 173a, 173b | source electrode |
| 175a, 175b | drain electrode | 180p, 180q | passivation layer |
| 185a, 185b | contact hole | 235a, 235b | openings |
| 191 | pixel electrode | 191a | first sub-pixel electrode |
| 191b | second sub-pixel electrode | 200 | upper substrate |
| 220 | light blocking member | 230 | color filter |
| 270 | common electrode | | |

DETAILED DESCRIPTION OF THE EXEMPLARY EMBODIMENTS

Exemplary embodiments of the present invention will be described in detail with reference to the accompanying drawings. However, the present invention is not limited to the exemplary embodiments described herein, and may be embodied in other forms.

of the organic layer 230. For example, the plane shape of the second region A' is extended in one direction at the central part of the first region A.

The upper passivation layer 180p or the lower passivation layer 180q may be formed of an inorganic insulating material such as, for example, silicon nitride or silicon oxide.

The organic layer 230 may be, for example, a color filter, and the color filter may be, for example, a blue color filter, a green color filter, or a red color filter. In the contact portion according to an exemplary embodiment of the present invention, the upper passivation layer 180q covers most of the organic layer 230 such that a slight change due to by-products of the color filter that are generated when forming the contact hole 185 may be prevented. Also, a portion of the upper passivation layer 180q is exposed before forming the second electrode 191, thereby having a function as an gas emitter. Accordingly, a filling failure of the liquid crystal due to bubbles generated by the components of the portion of the organic layer 230 may be prevented.

Referring to FIG. 3, a mask M that is opened at a portion corresponding to the first region A and the second region A' may be used to form the plane shape of the contact portion according to an exemplary embodiment of the present invention.

Figure 4:
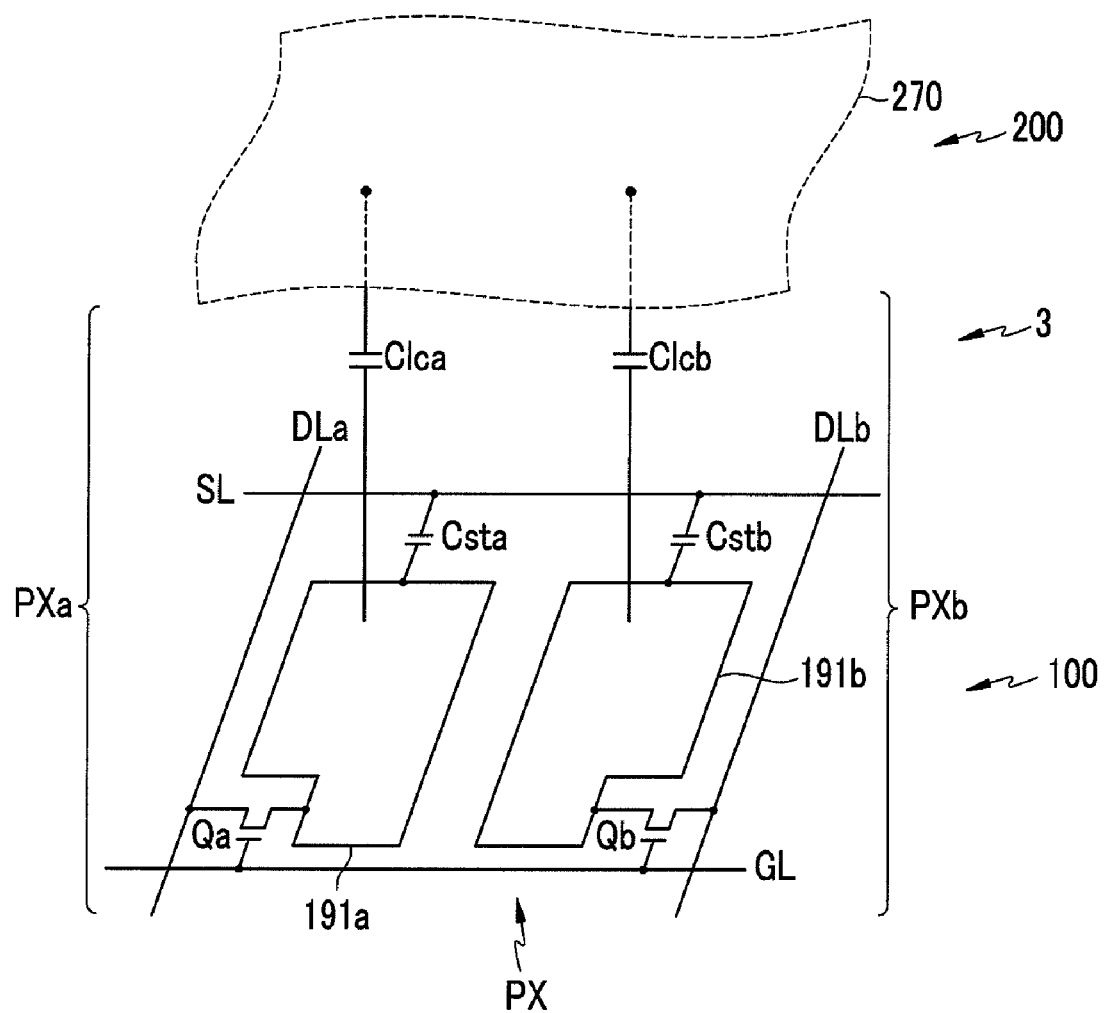
FIG. 4 is an equivalent circuit diagram of a pixel of a liquid crystal display according to an exemplary embodiment of the present invention.

FIG. 4 is an equivalent circuit diagram of a pixel of a liquid crystal display according to another exemplary embodiment of the present invention.

Referring to FIG. 4, a liquid crystal display according to an exemplary embodiment of the present invention includes a thin film transistor array panel 100 and a common electrode panel 200 facing each other, and a liquid crystal layer 3 interposed therebetween.

The liquid crystal display includes signal lines including a plurality of gate lines GL, a plurality of pairs of data lines DLa and DLb, and a plurality of storage electrode lines SL, and a plurality of pixels PX connected thereto.

The respective pixels PX include a pair of sub-pixels PXa and PXb, and each sub-pixel PXa/PXb includes a switching element Qa/Qb, a liquid crystal capacitor Clca/Clcb, and a storage capacitor Csta/Cstb.

Each switching element Qa/Qb is a three-terminal element such as a thin film transistor provided on the lower panel 100, and includes a control terminal connected to the gate line GL, an input terminal connected to the data line DLa/DLb, and an output terminal connected to the liquid crystal capacitor Clca/Clcb and the storage capacitor Csta/Cstb.

The liquid crystal capacitor Clca/Clcb uses a sub-pixel electrode 191a/191b and a common electrode 270 as two terminals. The liquid crystal layer 3 between the electrodes 191a/191b and 270 functions as a dielectric material.

The storage capacitor Csta/Cstb serving as an assistant to the liquid crystal capacitor Clca/Clcb is formed as a storage electrode line SL provided on the panel 100 and a sub-pixel electrode 191a/191b overlapped with an insulator interposed therebetween, and a predetermined voltage such as the common voltage Vcom is applied thereto.

The voltages charged at the two liquid crystal capacitors Clca and Clcb are established to slightly differ from each other. For example, the data voltage applied to the liquid crystal capacitor Clca may be established to be always lower or higher than the data voltage applied to the other liquid crystal capacitor Clcb. When the voltages of the two liquid crystal capacitors Clca and Clcb are properly controlled, an image viewed from the lateral side maximally approximates an image viewed from the frontal side, thereby improving the lateral visibility of the liquid crystal display.

Figure 5:
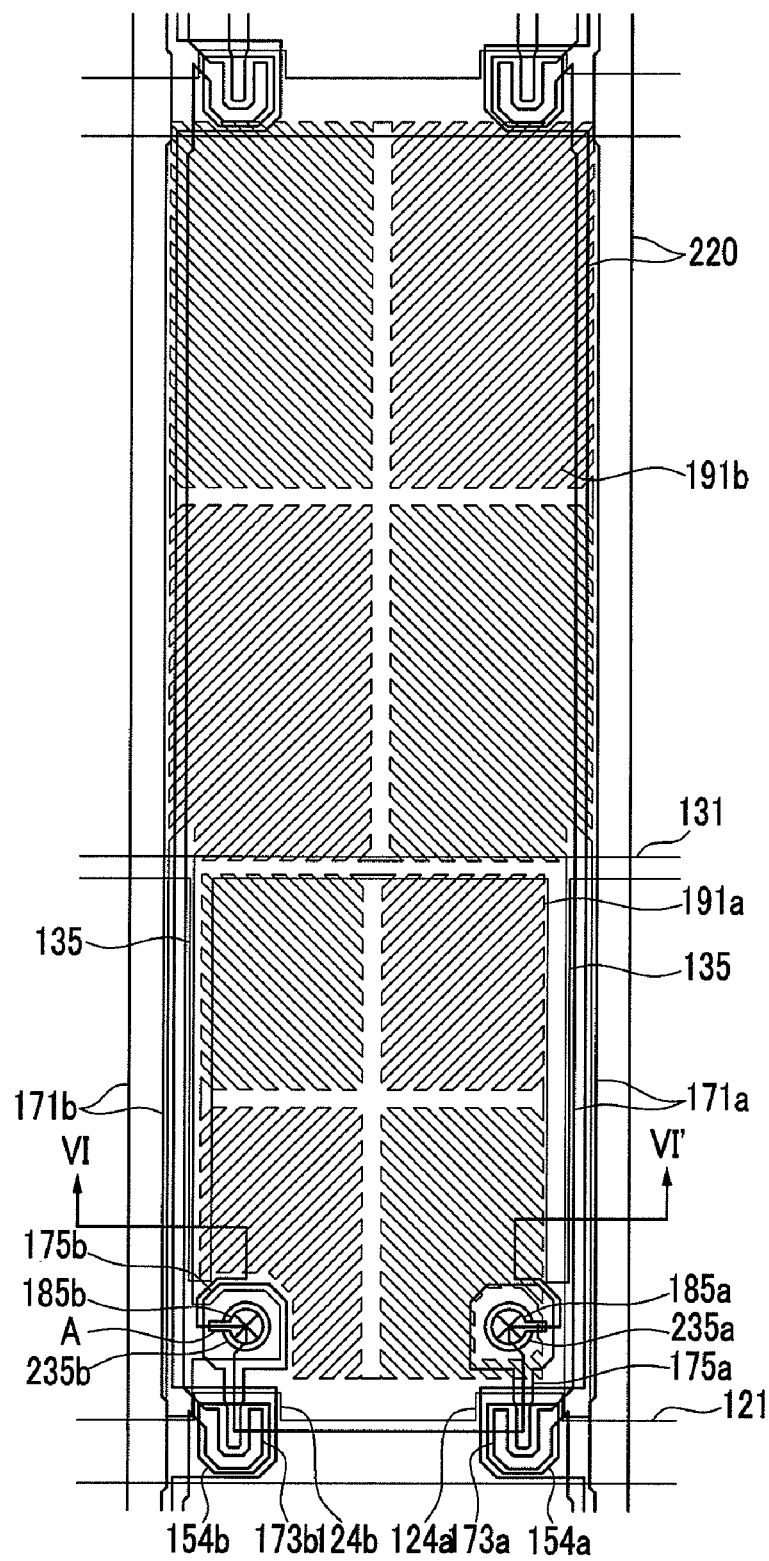
FIG. 5 is a layout view of a liquid crystal display according to an exemplary embodiment of the present invention.
Figure 6:
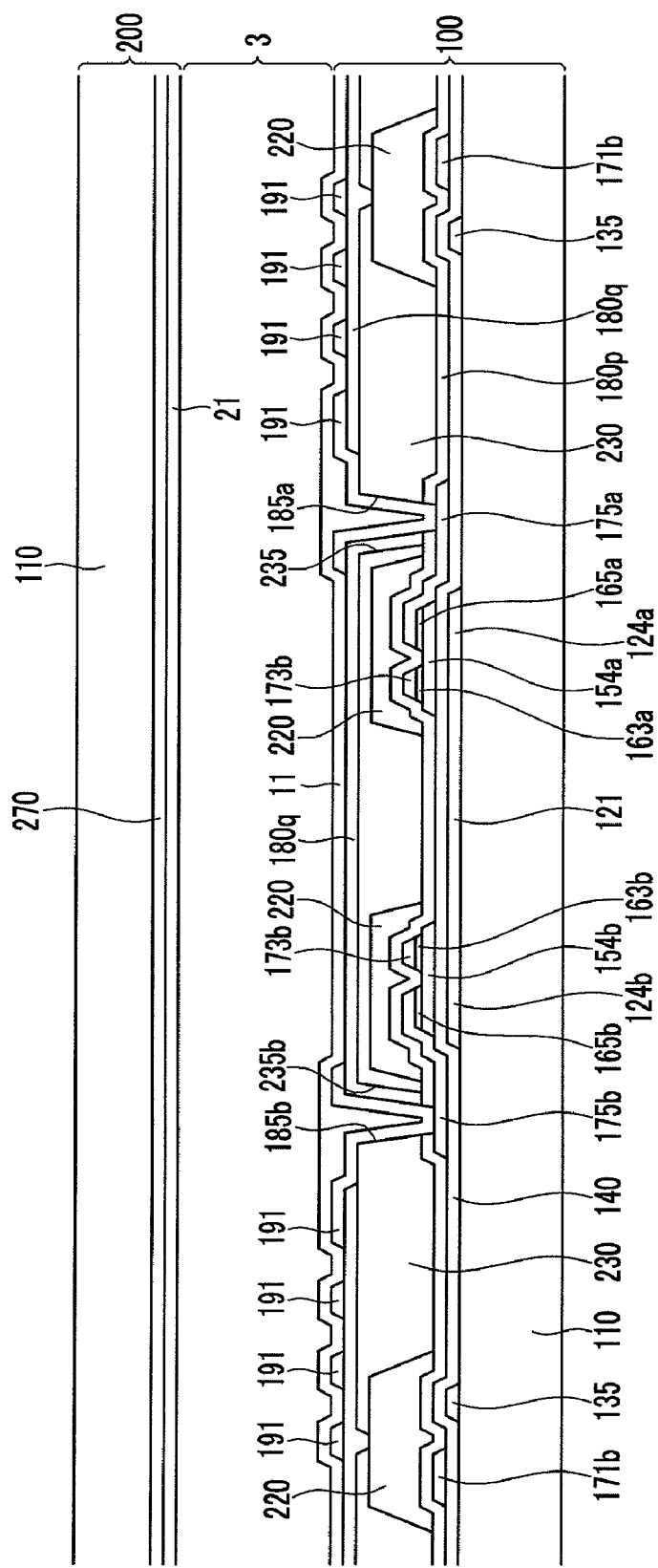
FIG. 6 is a cross-sectional view taken along the line VI-VI' of FIG. 5.

FIG. 5 is a layout view of a liquid crystal display according to an exemplary embodiment of the present invention, and FIG. 6 is a cross-sectional view taken along the line VI-VI' of FIG. 5.

Referring to FIG. 5 and FIG. 6, a liquid crystal display according to an exemplary embodiment of the present invention includes lower and upper display panels 100 and 200 facing each other, and a liquid crystal layer 3 interposed between the two panels 100 and 200.

The lower display panel 100 will be firstly described.

A plurality of gate lines 121 and a plurality of storage electrode lines 131 and 135 are formed on an insulation substrate 110.

The gate lines 121 transmit gate signals and are substantially extended in the transverse direction. Each gate line 121 includes a plurality of first and second gate electrodes 124a and 124b protruding upward.

The storage electrode lines include a stem 131 extending substantially parallel to the gate lines 121 and a plurality of storage electrodes 135 extended from the stem 131.

However, the shapes and arrangements of the storage electrode lines 131 and 135 may be modified in various forms.

A gate insulating layer 140 is formed on the gate lines 121 and the storage electrode lines 131 and 135, and a plurality of semiconductors 154a and 154b preferably made of, for example, amorphous or crystallized silicon are formed on the gate insulating layer 140.

A plurality of pairs of ohmic contacts 163b and 165b are formed on the first semiconductor 154b, and the ohmic contacts 163b and 165b may be formed of a material such as, for example, n+hydrogenated amorphous silicon in which an n-type impurity is doped with a high concentration, or of a silicide.

A plurality of pairs of data lines 171a and 171b and a plurality of pairs of first and second drain electrodes 175a and 175b are formed on the ohmic contacts 163b and 165b, and on the gate insulating layer 140.

The data lines 171a and 171b transmit data signals, extend substantially in the longitudinal direction, and cross the gate lines 121 and the stems 131 of the storage electrode lines. The data lines 171a/171b include a plurality of first/second source electrodes 173a/173b extending toward the first/second gate electrodes 124a/124b and curved with a "U" shape, and the first/second source electrodes 173a/173b are opposite to the first/second drain electrodes 175a/175b with respect to the first/second gate electrodes 124a/124b.

The first and second drain electrodes 175a and 175b respectively start from one end enclosed by the first and second source electrodes 173a and 173b and are extended upward, and the other end thereof may have a wide area for connection to another layer.

However, the shapes and arrangement of the first and second drain electrodes 175a and 175b and the data lines 171a and 171b may be modified in various forms.

The first/second gate electrodes 124a/124b, the first/second source electrodes 173a/173b, and the first/second drain electrodes 175a/175b respectively form the first/second thin film transistors (TFT) Qa/Qb along with the first/second semiconductors 154a/154b, and the channels of the first/second thin film transistors Qa/Qb are respectively formed on the first/second semiconductors 154a/154b between the first/second source electrodes 173a/173b and the first/second drain electrodes 175a/175b.

The ohmic contacts 163b and 165b are interposed only between the underlying semiconductor islands 154a and 154b, and the overlying data lines 171a and 171b and drain electrodes 175a and 175b, and reduce contact resistance between them. The semiconductors 154a and 154b have a portion that is exposed without being covered by the data lines 171a and 171b and the drain electrodes 175a and 175b, and a portion between the source electrodes 173a and 173b and the drain electrodes 175a and 175b.

A lower passivation layer 180p preferably made of, for example, silicon nitride or silicon oxide is formed on the data lines 171a and 171b, the drain electrodes 175a and 175b, and the exposed portions of the semiconductors 154a and 154b.

A light blocking member 220 that is separated by a predetermined interval is formed on the lower passivation layer 180p. The light blocking member 220 may include a straight portion extended upward and downward and a quadrangle portion corresponding to the thin film transistor, and prevents light leakage.

A plurality of color filters 230 are formed on the lower passivation layer 180p and the light blocking member 220. Most of the color filters 230 exist in the region enclosed by the light blocking member 220. The color filters 230 have a plurality of openings 235a and 235b on the first and second drain electrodes 175a and 175b. For example, the color filter 230 may be a green color filter.

Here, the lower passivation layer 180p may prevent the pigment of the color filter 230 from flowing into the portion of the semiconductors 154a and 154b.

An upper passivation layer 180q is formed on the light blocking member 220 and the color filter 230. For example, the upper passivation layer 180q may be made of an inorganic insulating material such as silicon nitride or silicon oxide, and may prevent the color filter 230 from lifting and suppress contamination of the liquid crystal layer 3 by an organic material such as a solvent flowing from the color filter 230, thereby preventing defects such as an afterimage that may be generated when driving the screen.

However, the light blocking member 220 may be positioned in the upper panel 200.

The upper passivation layer 180q and the lower passivation layer 180p have a plurality of contact holes 185a and 185b exposing the first and second drain electrodes 175a and 175b.

A plurality of pixel electrodes 191 are formed on the upper passivation layer 180q, and the color filter 230 may be extended according to the column of the pixel electrodes 191. Also, the branches 135 of the storage electrode line 131 are disposed between the pixel electrode 191 and the data lines 171a and 171b.

The pixel electrodes 191 may be formed with a transparent conductive material such as, for example, indium tin oxide (ITO) and indium zinc oxide (IZO), or with a reflective material such as, for example, aluminum, silver, chromium, and alloys thereof, and each pixel electrode 191 includes the first and second sub-pixel electrodes 191a and 191b that are separated from each other.

The first and second sub-pixel electrodes 191a and 191b are physico-electrically connected to the first and second drain electrodes 175a and 175b through the contact holes 185a and 185b so as to receive data voltages from the first and second drain electrodes 175a and 175b.

In the liquid crystal display according to an exemplary embodiment of the present invention, the contact portion where the drain electrodes 175a and 175b and the sub-pixel electrodes 191a and 191b are connected to each other may be applied with the description of the contact portion shown in FIG. 1 to FIG. 3.

For example, the contact holes 185a and 185b include a first region, a second region, and a third region. The drain electrodes 175a and 175b and the sub-pixel electrodes 191a and 191b contact in the first region. In the second region, a portion of the upper surface of the color filter 230 and the side wall thereof contact the sub-pixel electrodes 191a and 191b. In the third region, the upper surface of the color filter 230 and the side wall thereof cover the upper passivation layer 180q.

An alignment layer 11 is formed on the pixel electrode 191. Next, the upper panel 200 will be described.

In the upper panel 200, a common electrode 270 is formed on a transparent insulation substrate 210, and an alignment layer 21 is formed thereon.

The alignment layers 11 and 21 may be vertical alignment layers. Polarizers may be provided on the outer surfaces of the lower panel 100 and the upper panel 200.

The liquid crystal layer 3 is interposed between the lower panel 100 and the upper panel 200. The liquid crystal layer 3 may have negative dielectric anisotropy.

A liquid crystal display is described above, however it is not limited thereto, and the exemplary embodiment related to the contact portion described with reference to FIG. 1 to FIG. 3 may be applied to an organic light emitting device.

Hereinafter, variations of the exemplary embodiment related to the contact portion described with reference to FIG. 1 to FIG. 3 will be described.

Figure 7:
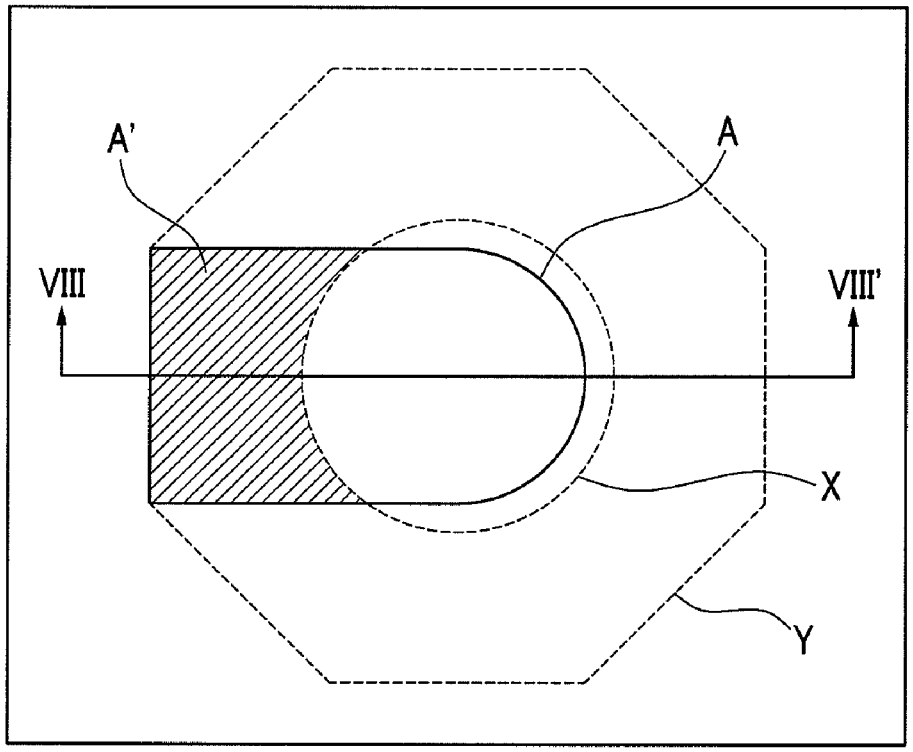
FIG. 7 is a top plan view of a contact portion according to an exemplary embodiment of the present invention.
Figure 8:
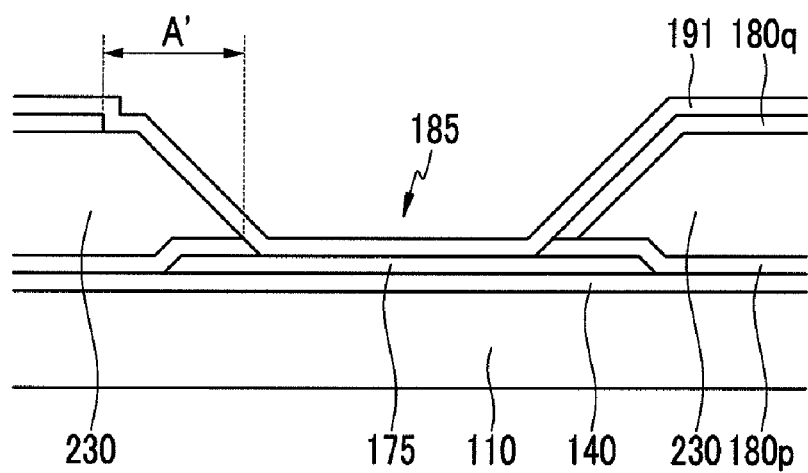
FIG. 8 is a cross-sectional view taken along the line VIII-VIII' of FIG. 7.
Figure 9:
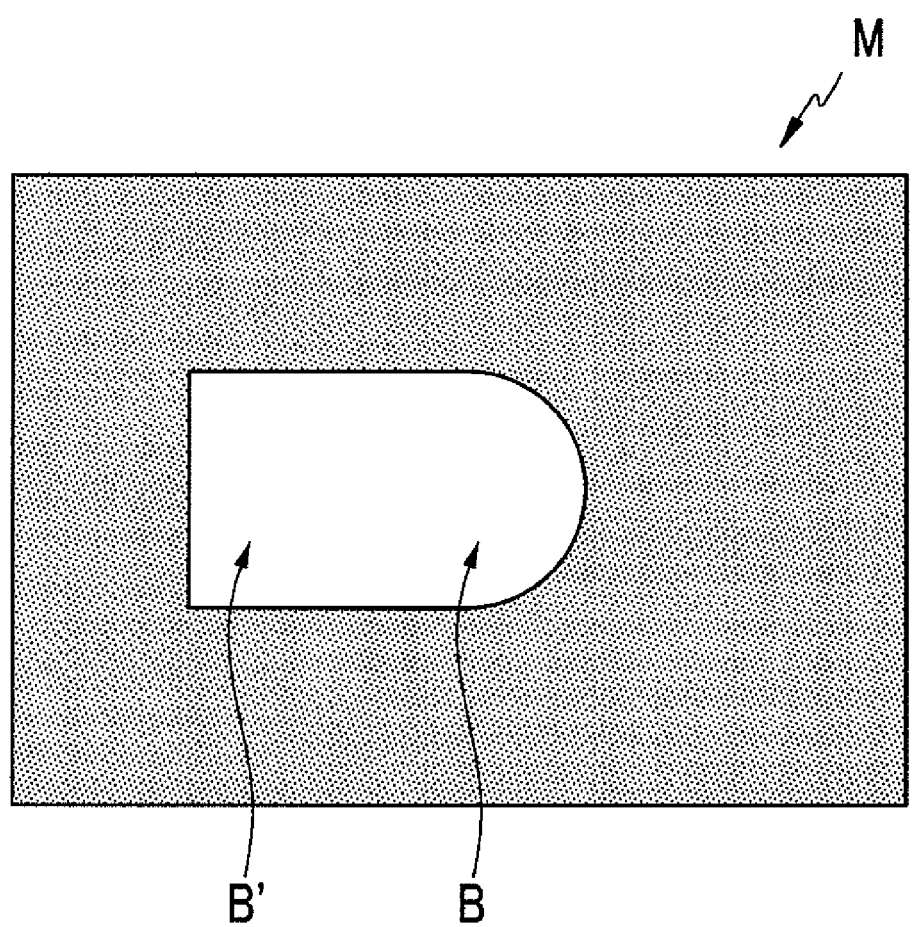
FIG. 9 is a top plan view of a mask used in the exemplary embodiment shown in FIG. 7.

FIG. 7 is a top plan view of a contact portion according to another exemplary embodiment of the present invention, FIG. 8 is a cross-sectional view taken along the line VIII-VIII' of FIG. 7, and FIG. 9 is a top plan view of a mask used in the exemplary embodiment shown in FIG. 7.

Referring to FIG. 7 and FIG. 8, most of the structure according to the present exemplary embodiment is almost the same as the contact portion described with reference to FIG. 1 to FIG. 3 (hereinafter referred to as a contact portion according to the first exemplary embodiment).

However, different from the contact portion according to the first exemplary embodiment, the width of the second region A' in the present exemplary embodiment is widely formed. The plane shape of the second region A' has the same width as the first region A, and may be extended in one direction from the central part of the first region A. For example, compared with the contact portion according to the first exemplary embodiment, the organic layer 230 and the second electrode 191 directly contact in the further wide range.

Referring to FIG. 9, to form the plane shape of the contact portion according to an exemplary embodiment of the present invention, a mask M that is opened at a portion corresponding to the first region A and the second region A' may be used. Here, the width of the region B' that is opened corresponding to the second region A' may be the same as the width of the region B that is opened corresponding to the first region A.

Figure 10:
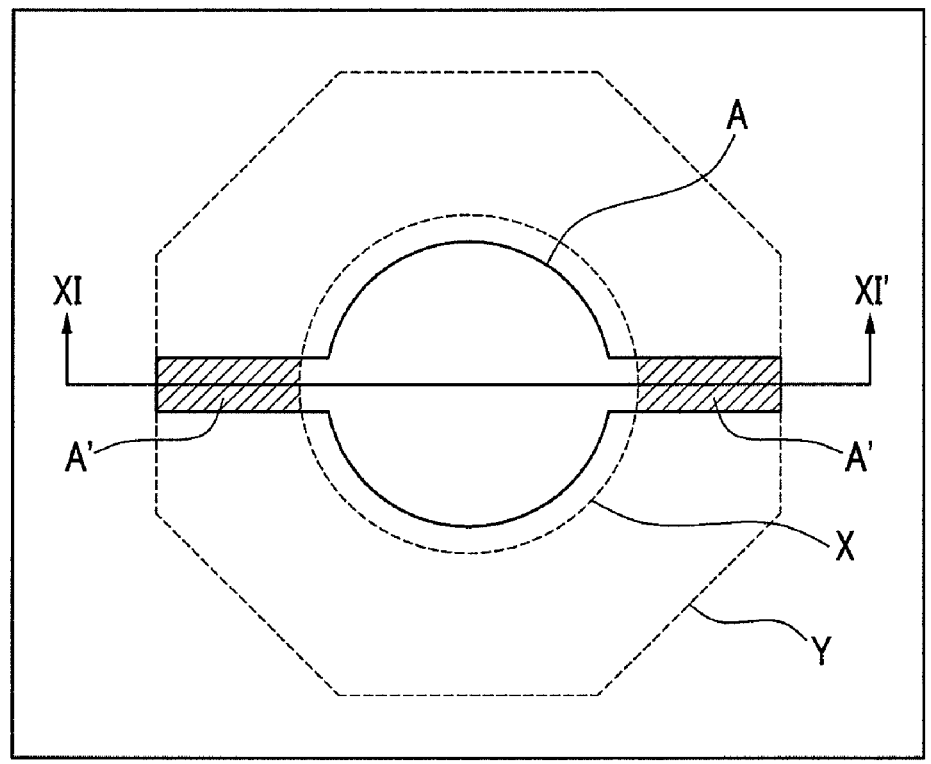
FIG. 10 is a top plan view of a contact portion according to an exemplary embodiment of the present invention.
Figure 11:
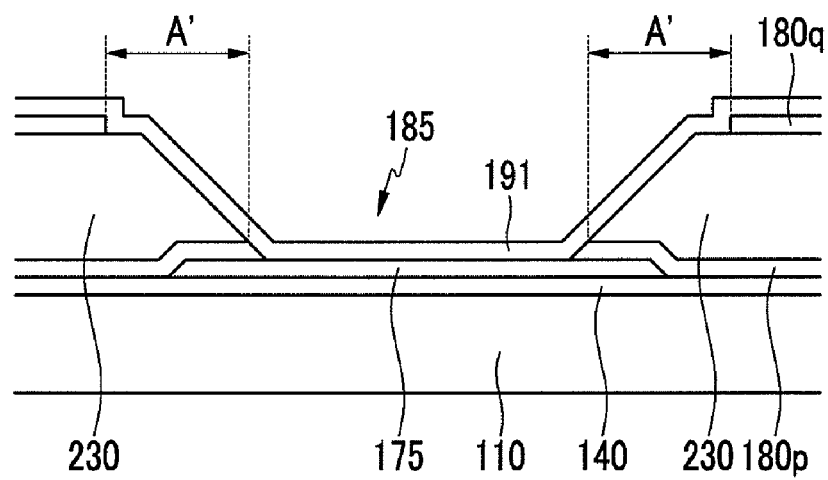
FIG. 11 is a cross-sectional view taken along the line XI-XI' of FIG. 10.
Figure 12:
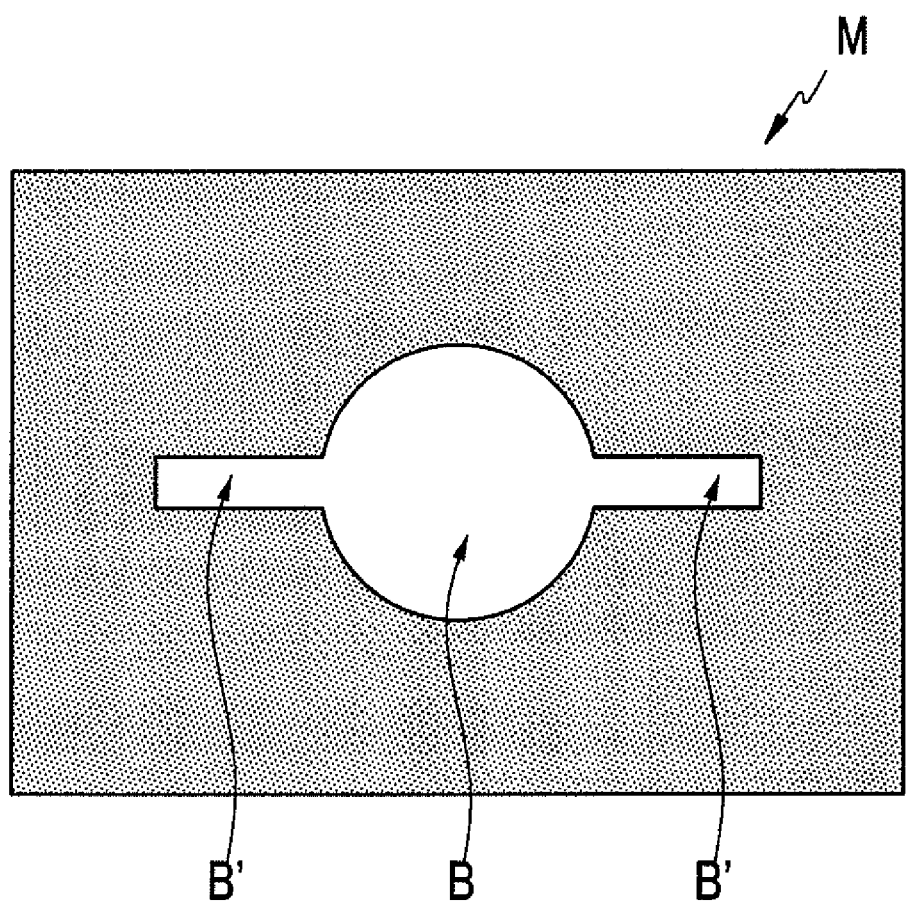
FIG. 12 is a top plan view of a mask used in the exemplary embodiment shown in FIG. 10.

FIG. 10 is a top plan view of a contact portion according to another exemplary embodiment of the present invention, FIG. 11 is a cross-sectional view taken along the line XI-XI' of FIG. 10, and FIG. 12 is a top plan view of a mask used in the exemplary embodiment shown in FIG. 10.

Referring to FIG. 10 and FIG. 11, most of the structure is the same as the contact portion according to the first exemplary embodiment.

However, different from the contact portion according to the first exemplary embodiment, the plane shape of the second region A' in the present exemplary embodiment is extended in the leftward and rightward directions from the central part of the first region A, thereby forming a straight line shape. For example, the organic layer 230 and the second electrode 191 directly contact each other in the region about two times compared with the contact portion according to the first exemplary embodiment.

Referring to FIG. 12, to form the plane shape of the contact portion according to an exemplary embodiment of the present invention, a mask M that is opened at the portion corresponding to the first region A and the second region A' may be used. Here, the opened region B' corresponding to the second region A' is extended in the leftward and rightward directions from the central part of the opened region B corresponding to the first region A, thereby forming the straight shape. In the exemplary embodiment according to the present invention, it is considered that the mask is misaligned such that the area where the organic layer 230 is exposed is decreased when the upper passivation layer 180q is patterned.

Figure 13:
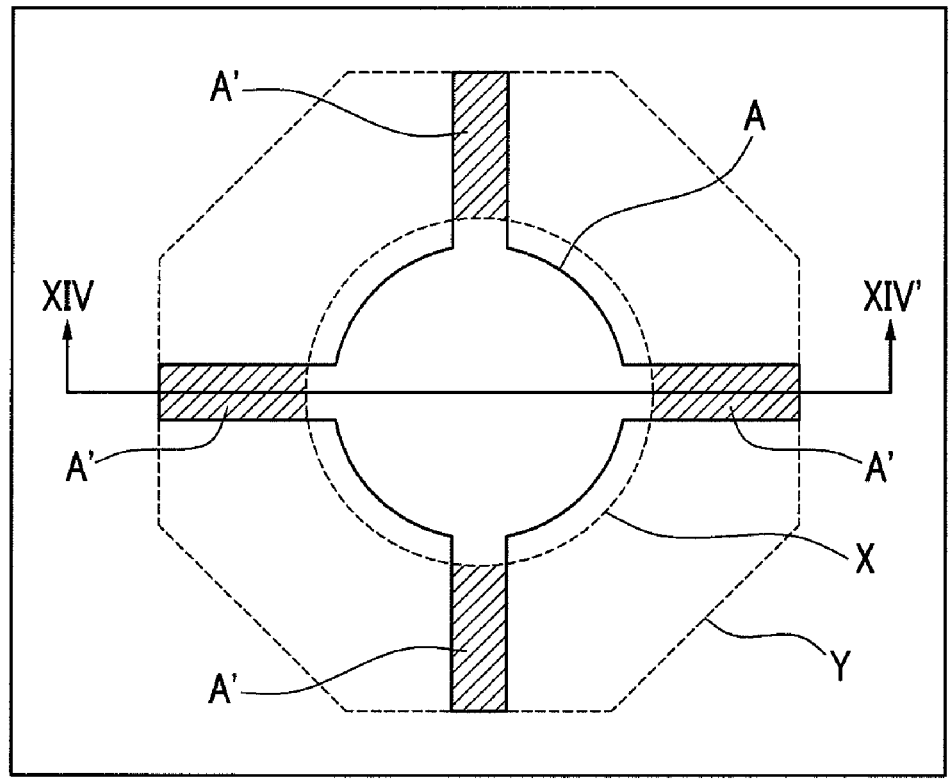
FIG. 13 is a top plan view of a contact portion according to an exemplary embodiment of the present invention.
Figure 14:
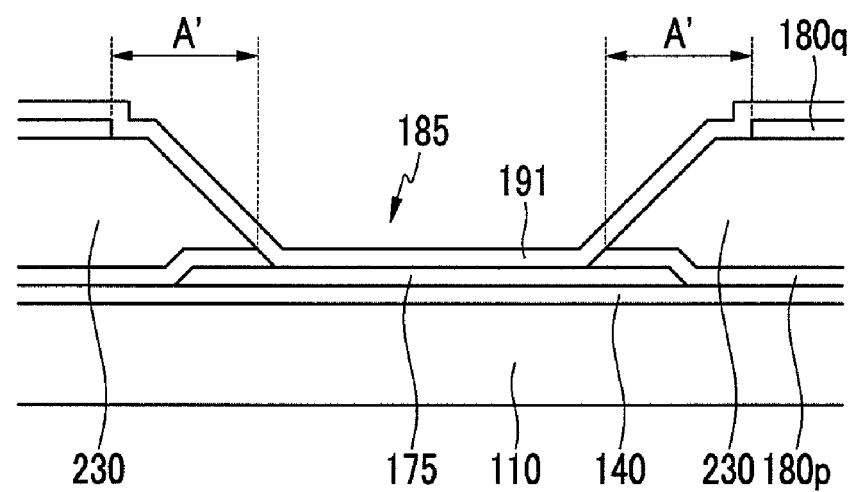
FIG. 14 is a cross-sectional view taken along the line XIV-XIV' of FIG. 13.
Figure 15:
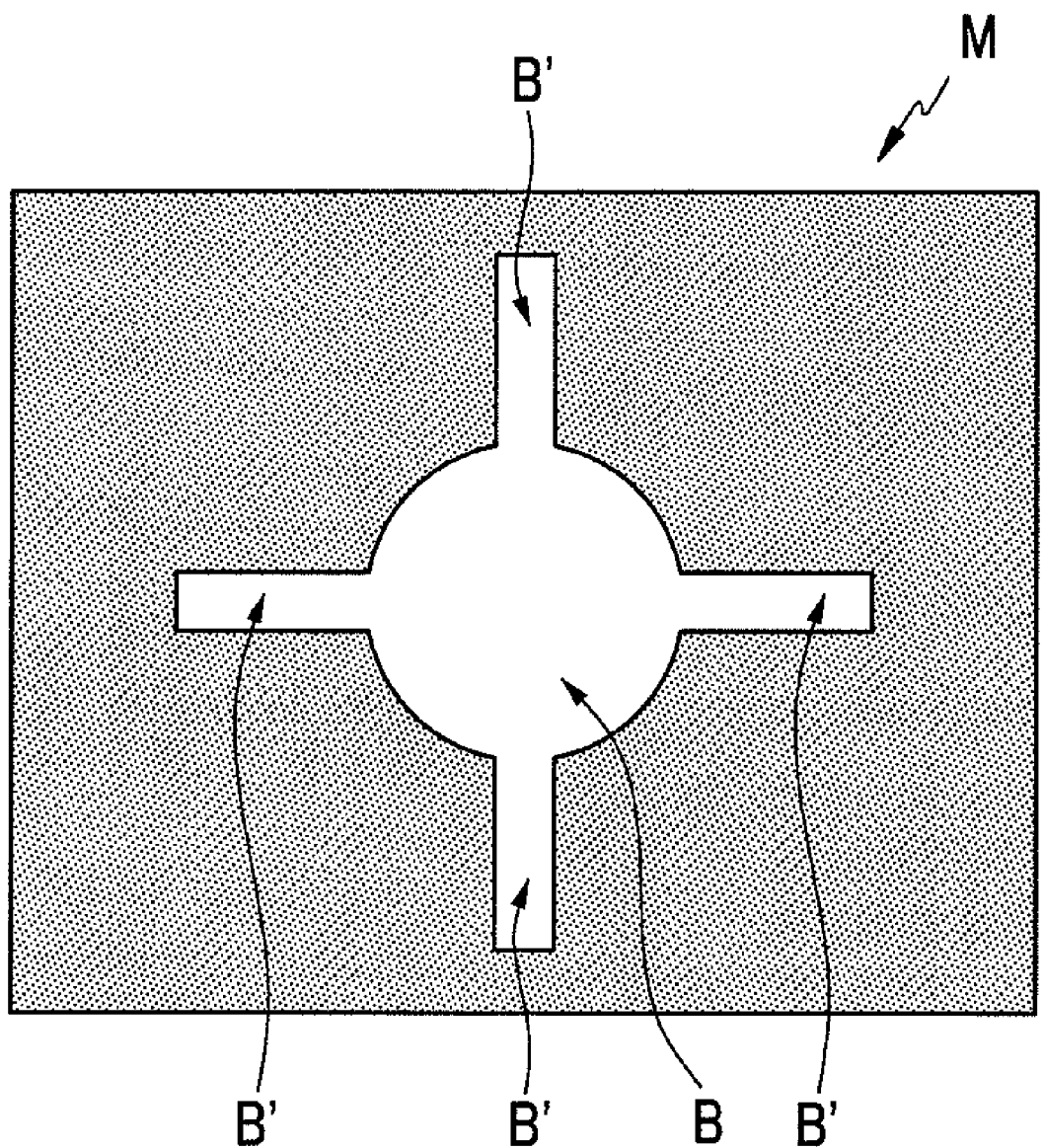
FIG. 15 is a top plan view of a mask used in the exemplary embodiment shown in FIG. 13.

FIG. 13 is a top plan view of a contact portion according to another exemplary embodiment of the present invention, FIG. 14 is a cross-sectional view taken along the line XIV-XIV' of FIG. 13, and FIG. 15 is a top plan view of a mask used in the exemplary embodiment shown in FIG. 13.

Referring to FIG. 13 and FIG. 14, most of the structure is the same as the contact portion according to the first exemplary embodiment.

However, different from the contact portion according to the first exemplary embodiment, the plane shape of the second region A' in the present exemplary embodiment is extended in leftward, rightward, upward, and downward directions from the central part of the first region A, thereby forming a crossed shape. For example, the organic layer 230 and the second electrode 191 directly contact each other in the region about four times compared with the contact portion according to the first exemplary embodiment.

Referring to FIG. 15, to form the plane shape of the contact portion according to an exemplary embodiment of the present invention, a mask M that is opened at the portion corresponding to the first region A and the second region A' may be used. Here, the opened region B' corresponding to the second region A' is extended in the leftward, rightward, upward, and downward directions from the central part of the opened region B corresponding to the first region A, thereby forming the crossed shape.

Hereinafter, a method for forming a contact portion according to an exemplary embodiment of the present invention will be described with reference to FIG. 1 to FIG. 3.

An insulating layer 140 is formed on an insulation substrate 110. The first electrode 175 made of a conductive material is formed on the insulating layer 140. A lower insulating material covering the first electrode 175 is formed on the first electrode 175. A first photoresist material is coated on the lower insulating material and patterned through a photolithography process to form an organic layer 230 including a contact hole 185.

An upper insulating material filling the contact hole 185 is formed on the organic layer 230. A second photoresist material is coated on the upper insulating material, and the upper insulating material and the lower insulating material are etched through photolithography process to form a lower passivation layer 180p, an upper passivation layer 180q, and a contact hole 185. Here, the photomask of FIG. 3 may be used for patterning. In another exemplary embodiment, one of the photomasks of FIG. 9, FIG. 12, and FIG. 15 may be used.

The second electrode 191 contacting the first electrode 175 at the contact hole 185 is formed on the upper passivation layer 180q.

The organic layer 230 may be, for example, a color filter, and the color filter may be, for example, a blue color filter, a green color filter, or a red color filter. In the contact portion according to an exemplary embodiment of the present invention, the upper passivation layer 180q covers most of the organic layer 230 such that a slight change due to by-products of the color filter that are generated when forming the contact hole 185 may be prevented. Also, a portion of the upper passivation layer 180q is exposed before forming the second electrode 191, thereby having a function as an gas emitter. Accordingly, the filling failure of the liquid crystal due to bubbles generated by the components of the portion of the organic layer 230 may be prevented.

Hereinafter, a manufacturing method of a liquid crystal display according to an exemplary embodiment of the present invention will be described with reference to FIG. 5 and FIG. 6.

Firstly, an upper panel 100 and a lower panel 200 are manufactured.

The lower panel 100 is manufactured as follows.

A plurality of thin films are deposited and patterned on a substrate 110 to sequentially form a gate line 121 including gate electrodes 124a and 124b, a gate insulating layer 140, semiconductors 154a and 154b, data lines 171a and 171b respectively including source electrodes 173a and 173b, drain electrodes 175a and 175b, and a lower passivation layer 180p.

Next, a light blocking member 220 preventing light leakage is formed on the lower passivation layer 180p, and a plurality of color filters 230 are formed on the lower passivation layer 180p and the light blocking member 220. The color filters 230 may be made of an organic material, and may have a plurality of openings 235a and 235b formed through a photolithography process.

An upper passivation layer 180q is formed on the light blocking member 220 and the color filter 230.

A method for forming the lower passivation layer 180p, the color filter 230, and the upper passivation layer 180q will be described in detail.

The first insulating material covering the data lines 171a and 171b including the source electrode 173a and 173b, and the drain electrodes 175a and 175b, is formed, and the first photoresist material is coated on the first insulating material. The resist material is patterned through a photolithography process to form a color filter 230 having a plurality of openings 235a and 235b.

The second insulating material filling a plurality of openings 235a and 235b is coated on the color filter 230. The second photoresist material is coated on the second insulating material. The second photoresist material is patterned through a photolithography process. Here, the photomask of FIG. 3, FIG. 9, FIG. 12, or FIG. 15 may be used for patterning.

After the second photoresist material is removed by using a developing solution, a conductive layer such as, for example, ITO or IZO is deposited and patterned on the upper passivation layer 180q to form a pixel electrode 191.

Next, an alignment layer 11 is formed on the pixel electrode 191.

The upper panel 200 is manufactured as follows.

A common electrode 270 is formed on a substrate 210. Next, an alignment layer 21 is formed on the common electrode 270.

Next, the lower panel 100 and the upper panel 200 that are manufactured as described above are assembled, and liquid crystal is injected therebetween to form a liquid crystal layer 3. However, the liquid crystal layer 3 may be formed by, for example, dripping the liquid crystal on the lower panel 100 or the upper panel 200.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:
1. A thin film transistor array panel comprising:
a substrate;
a gate line disposed on the substrate;
a data line intersecting the gate line;
a drain electrode separated from the data line;
a first insulating layer covering the data line;
a color filter disposed on the first insulating layer;
a second insulating layer disposed on the color filter and having a contact hole exposing the drain electrode and the color filter; and a pixel electrode disposed on the second insulating layer and connected to the drain electrode through the contact hole, wherein the contact hole partially exposes the color filter near the portion where the drain electrode and the pixel electrode are connected to each other, and the pixel electrode contacts an upper surface and a first sidewall of the color filter exposed through the contact hole and wherein the second insulating layer covers a second sidewall of the color filter in the contact hole.

2. The thin film transistor array panel of claim 1, wherein the contact hole has a first region, a second region and a third region, the first region is a portion where the drain electrode and the pixel electrode contact each other, the second region is a portion where the color filter and the pixel electrode contact each other at the upper surface and the first sidewall of the color filter, and the third region is a portion where the second insulating layer covers the second sidewall of the color filter.

3. The thin film transistor array panel of claim 2, wherein at least one of the first insulating layer and the second insulating layer is made of an inorganic insulating material.

4. The thin film transistor array panel of claim 3, wherein a plane shape of the second region is extended in a first direction from a central part of the first region.

5. The thin film transistor array panel of claim 3, wherein a plane shape of the second region is extended in a first direction from a central part of the first region while having a same width as the first region.

6. The thin film transistor array panel of claim 2, wherein a plane shape of the second region is extended in leftward and rightward directions from a central part of the first region, thereby forming a straight shape.

7. The thin film transistor array panel of claim 6, wherein at least one of the first insulating layer and the second insulating layer is formed of an inorganic insulating material.

8. The thin film transistor array panel of claim 2, wherein a plane shape of the second region is extended in leftward, rightward, upward, and downward directions from a central part of the first region, thereby forming a cross shape.

9. The thin film transistor array panel of claim 8, wherein at least one of the first insulating layer and the second insulating layer is formed of an inorganic insulating material.

10. The thin film transistor array panel of claim 1, wherein the color filter is formed of an organic material.

11. The thin film transistor array panel of claim 10, wherein the contact hole has a first region, a second region and a third region, the first region is a portion where the drain electrode and the pixel electrode contact each other, the second region is a portion where the color filter and the pixel electrode contact each other at the upper surface and the first sidewall of the color filter, and the third region is a portion where the second insulating layer covers the second sidewall of the color filter.

12. The thin film transistor array panel of claim 11, wherein a plane shape of the second region is extended in leftward and rightward directions from a central part of the first region, thereby forming a straight shape.

13. The thin film transistor array panel of claim 12, wherein at least one of the first insulating layer and the second insulating layer is formed of an inorganic insulating material.

14. The thin film transistor array panel of claim 11, wherein a plane shape of the second region is extended in leftward, rightward, upward, and downward directions from a central part of the first region, thereby forming a cross shape.

15. The thin film transistor array panel of claim 14, wherein at least one of the first insulating layer and the second insulating layer is formed of an inorganic insulating material.

16. The thin film transistor array panel of claim 1, wherein the pixel electrode formed on the second insulating layer contacts the drain electrode at the contact hole, and wherein in this contact portion, the second insulating layer covers almost the whole color filter and the pixel electrode covers a remaining part of the color filter including the portion of the color filter which is exposed through the contact hole.

17. A method of manufacturing a thin film transistor array panel comprising:
forming a gate line on a substrate;
forming a data line intersecting the gate line and a drain electrode separated from the data line;
forming a first insulating layer covering the data line;
forming a color filter having an opening on the first insulating layer;
forming a second insulating layer covering the opening on the color filter;
forming a contact hole by patterning the first insulating layer and the second insulating layer; and
forming a pixel electrode contacting the drain electrode filling the contact hole,
wherein the forming of the contact hole comprises exposing the upper surface of the drain electrode and eliminating a portion of the second insulating layer covering a first sidewall and an upper surface of the color filter in a position adjacent to the opening such that the contact hole exposes the first sidewall and the upper surface of the color filter from which the portion of the second insulating layer has been removed prior to forming the pixel electrode, and
wherein the second insulating layer covers a second sidewall of the color filter in the contact hole.

18. The method of claim 17, wherein the forming of the pixel electrode comprises covering directly the first sidewall and the upper surface of the color filter exposed by eliminating the portion of the second insulating layer.

19. The method of claim 18, wherein the forming of the color filter having an opening comprises using a photolithography process.

20. The method of claim 17, wherein the forming of the contact hole further comprises forming a first region where the drain electrode and the pixel electrode contact each other, a second region where the color filter and the pixel electrode contact each other at the upper surface and the first sidewall of the color filter, and a third region where the second insulating layer covers the second sidewall of the color filter.

21. The method of claim 20, wherein at least one of the first insulating layer and the second insulating layer is made of an inorganic insulating material.

22. The method of claim 21, wherein a plane shape of the second region is extended in a first direction from a central part of the first region.

23. The method of claim 21, wherein a plane shape of the second region is extended in the first direction from a central part of the first region while having a same width as the first region.

24. The method of claim 21, wherein a plane shape of the second region is extended in leftward and rightward directions from a central part of the first region, thereby forming a straight shape.

25. The method of claim 21, wherein a plane shape of the second region is extended in leftward, rightward, upward, and downward directions from a central part of the first region, thereby forming a cross shape.

* * * * *